(12) United States Patent
Chou et al.

(10) Patent No.: US 6,745,139 B2
(45) Date of Patent: Jun. 1, 2004

(54) CAE WAVEFORM ASSESSOR

(75) Inventors: Clifford C Chou, Farmington Hills, MI (US); Jialiang Le, Pittsfield, MI (US); Ping Chen, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 126 days.

(21) Appl. No.: 10/064,760

(22) Filed: Aug. 14, 2002

(65) Prior Publication Data

US 2004/0034488 A1 Feb. 19, 2004

(51) Int. Cl.[7] .................................................. G06G 3/10
(52) U.S. Cl. ............................................. 702/66; 703/6
(58) Field of Search ................................ 703/2, 5, 4, 8; 702/38, 57, 66, 94–97, 104, 142, 143, 150–153, 189; 701/1, 2, 23, 116, 223, 301

(56) References Cited

U.S. PATENT DOCUMENTS

| | | | |
|---|---|---|---|
| 5,065,322 A | * 11/1991 | Mazur et al. ................. | 701/47 |
| 5,185,701 A | * 2/1993 | Blackburn et al. ............ | 701/45 |
| 5,251,161 A | * 10/1993 | Gioutsos et al. ............... | 703/2 |
| 5,345,402 A | 9/1994 | Gioutsos et al. ............... | 703/8 |
| 5,461,566 A | 10/1995 | Musser et al. ................ | 701/45 |
| 5,563,791 A | 10/1996 | Gioutsos et al. .............. | 701/45 |
| 5,608,629 A | * 3/1997 | Cuddihy et al. ............... | 701/1 |
| 6,195,625 B1 | * 2/2001 | Day et al. ...................... | 703/7 |

* cited by examiner

Primary Examiner—Marc S. Hoff
Assistant Examiner—Edward Raymond
(74) Attorney, Agent, or Firm—Frank A. MacKenzie

(57) ABSTRACT

A CAE waveform assessor 10 is provided, including a CAE resultant waveform 12 and a reference waveform 16. The CAE waveform assessor 10 utilizes a time domain assessor 18 to produce a time domain index 22 by comparing the CAE resultant waveform 12 with the reference waveform 16. A frequency domain assessor 20 produces a frequency domain index 24 by comparing the CAE resultant waveform 12 with the reference waveform 16. Finally, an overall assessor 26 combines the time domain index 22 with the frequency domain index 24 to produce an overall index 28:

11 Claims, 10 Drawing Sheets

| Time Frame Index | Percentage of Difference |
|---|---|
| 5 | 0.0-2.5 |
| 4 | 2.5-5.0 |
| 3 | 5.0-7.5 |
| 2 | 7.5-10.0 |
| 1 | 10.0-12.5 |
| 0 | Above 12.5 |

FIG. 2A

Velocity Rating Table

| Time Domain Index | Time Frame Index | | | | | |
|---|---|---|---|---|---|---|
| | 5 | 4 | 3 | 2 | 1 | 0 |
| 5 | | <10% | — | — | — | — |
| 4 | | | <5% | — | — | — |
| | >95% | | | <2% | — | — |
| 3 | | | | <5% | — | — |
| | >95% | | | | <2% | — |
| 2 | | | | | <5% | — |
| | >90% | | | | | <4% |
| 1 | | | | | | <10% |
| 0 | | | | | | >10% |

FIG. 2B

Frequency Rating Table

| Frequency Index | 5 | 4 | 3 | 2 | 1 | 0 |
|---|---|---|---|---|---|---|
| First Large Peak 0-50 Hz | 0-5% | 5-10% | 10-15% | 15-20% | 20-25% | >25% |
| 50-400 Hz | 0-10% | 10-20% | 20-30% | 30-40% | 40-50% | >50% |
| 220-370 Hz 400-600 Hz | 0-25% | 25-50% | 50-75% | 75-100% | 100-125% | >125% |

| Regions | First Large Peak | 0-50 Hz | 50-400 Hz | 220-370 Hz | 400-600 Hz |
|---|---|---|---|---|---|
| Calculations | Magnitude | Area | Area | Area | Area |
| Coefficients | 1.0 | 1.0 | 1.0 | 1.0 | 1.0 |
| Objectives to Evaluation | Low Frequency Accuracy | Low Frequency Accuracy | Majority Algorithm Effective Range | CAE Connections | High Frequency Requirement |
| For Algorithms | Vel. & Acc. | Vel. & Acc. | Vel. & Acc. | Acc. | Acc. |

FIG. 3B

Overall Table Index

| Rating Index | Single Point Sensor System | Advanced Restraint System |
|---|---|---|
| Velocity | Same as Velocity Rating Table | 0.7 * (Max (First Large Peak, 0-50 Hz)) + 0.3 * (50-400 Hz) |
| Frequency | Min (Max (First Large Peak, 0-50 Hz), 50-400 Hz) ① | |
| | Min (Max (First Large Peak, 0-50 Hz), 50-400 Hz, 220-370 Hz, 400-600 Hz) ② | |
| Overall | Min (Velocity, Frequency) | 0.6 * Velocity + 0.4 * Frequency |
| Note: ① for Velocity Base and ② for Acceleration Base Algorithm | | |

FIG. 4

| Location | Tunnel | Front Crash Sensor |
|---|---|---|
| Zero Index Accumulation of Velocity Rating | >20% | >30% |
| Combination of Frequency Rating | No | No |
| Overall Rating | 0 | 0 |

FIG. 5

Index Table

| Index | Level | Comments |
|---|---|---|
| 5 | High | CAE Will Be Used in Sensor Algorithm Calibration as Simulated Test Condition. |
| 4 | Low | |
| 3 | High | CAE Will Be Used in Sensor Algorithm Calibration as One of the Test Variations. |
| 2 | Low | |
| 1 | High | CAE Will Be Used as Reference Only. |
| 0 | Low | |

FIG. 6

CAE WAVEFORM ASSESSOR

BACKGROUND OF INVENTION

The present invention relates generally to a CAE waveform assessor and more particularly to an apparatus for quantifying dynamic crash pulse quality.

Automotive design techniques have undergone significant change and are frequently operating under new paradox. One such region of development is popularly known as computer-aided engineering or CAE. CAE allows engineers to design and model automotive structures and perform analysis on the integrity and safety of such structures prior to the physical construction of a vehicle. These techniques have provided for significant cost savings in the automotive design process. In addition, the timeline between conception and line production has been significantly reduced. These advantages have placed CAE into a fundamental role within modern automotive design practices.

Although CAE methodologies are widely accepted as providing cost and timesavings to the automotive industry, they often provide a variety of concerns to engineering developers. One area of concern revolves around the accuracy and reliability of CAE results. Modeling techniques, restraint conditions, loading functions, and engineering assumptions can all serve to vary the results of a CAE analysis as compared to the results of physical testing. In this vein, engineering within the CAE field have spent considerable time seeking methodologies for improving the accuracy of CAE results.

One such technique has been to develop highly specific modeling and loading forms geared toward specific applications. Physical testing is then utilized to confirm the results and accuracy of the CAE analysis. When proper correlation has been achieved, future analysis can then be performed under such strict modeling guidelines. Although this technique can prove successful, it is often associated with high costs and reduced flexibility. Often such techniques are not amenable to alteration of the engineering constraints utilized in the physical verification process. When such alterations become necessary, it is often not possible to properly evaluate the output of the resulting CAE analysis.

An area particularly vulnerable to these present methodologies of CAE verification is known as dynamic crash analysis. Dynamic crash analysis is utilized to simulate large displacement impact scenarios. Vehicle impact simulations are performed for a variety of reasons, including analysis of vehicle integrity, vehicle and passenger safety, and vehicle compliance with government standards. The use of such dynamic analysis is particularly valuable when taken in light of the large costs and destructive nature of physical automotive crash testing. The nature of the simulations, however, often involve considerable and complex analysis. This can make dynamic crash CAE simulations highly acceptable to the aforementioned analysis techniques.

Additionally, the CAE analysis is used by multiple departments within a company and by suppliers, the necessity for a controlling department to analyze and evaluate the results of such multiple departments may become necessary. A quantifiable technique for evaluating such results would not only provide engineers with confidence in the CAE results but would also provide a methodology for improving CAE techniques without the need for additional physical testing. It would, therefore, be highly desirable to have a method and apparatus for analyzing and quantifying resultant CAE waveforms such as dynamic crash pulse.

SUMMARY OF INVENTION

It is, therefore, an object of the present invention to provide a method and apparatus for analyzing CAE waveforms. It is a further object of the present invention to provide a method and apparatus capable of quantizing the dynamic crash pulse waveform from a CAE analysis.

In accordance with the objects of the present invention, a CAE waveform assessor is provided. The CAE waveform assessor includes a CAE resultant waveform and a reference waveform. The CAE waveform assessor further includes a time domain assessor producing a time domain index by comparing the CAE resultant waveform with the reference waveform. The CAE waveform assessor also includes a frequency domain assessor producing a frequency domain index by comparing the CAE resultant waveform with the reference waveform. Finally, the CAE waveform assessor includes an overall assessor combining the time domain index and the frequency domain index to produce an overall index.

Other objects and features of the present invention will become apparent when viewed in light of the detailed description of the preferred embodiment when taken in conjunction with the attached drawings and appended claims.

BRIEF DESCRIPTION OF DRAWINGS

FIG. 2A is a detailed illustration of a time frame index table for use in the CAE waveform assessor;

FIG. 2B is an illustration of a time domain index table for use with the CAE waveform assessor;

FIG. 3A is an illustration of a frequency domain index table for use with the CAE waveform assessor;

FIG. 3B is an illustration of a frequency domain waveform breakdown table for use with the CAE waveform assessor;

FIG. 4 is an illustration of an overall index table for use with the CAE waveform assessor;

FIG. 5 is an illustration of an additional constraint table for use with the CAE waveform assessor;

FIG. 6 is an illustration of an overall index interpretation table for use with the CAE waveform assessor;

DETAILED DESCRIPTION

Figure 1:
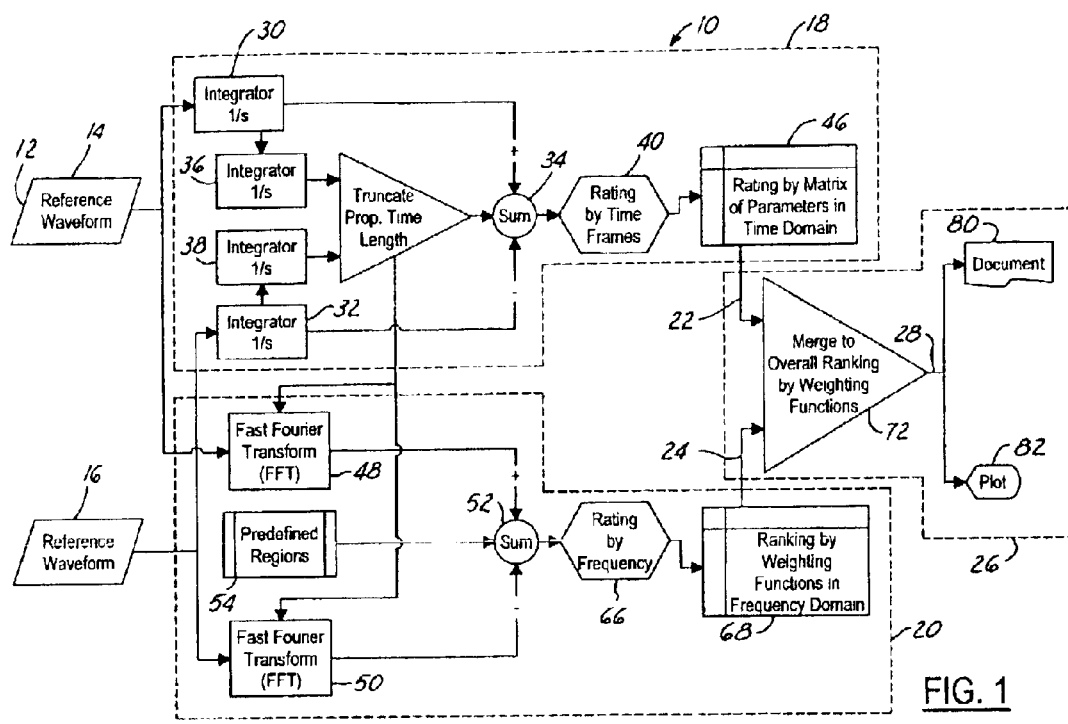
FIG. 1 is a flow chart illustration of an embodiment of a CAE waveform assessor in accordance with the present invention.

Referring now to FIG. 1, which is an illustration of a CAE waveform assessor 10 in accordance with the present invention. The CAE waveform assessor 10 is preferable for use to provide an objective reading to dynamic crash pulses. The dynamic crash pulses preferably originate from CAE simulations, sled tests, crash tests, surrogate tests, math model simulation, and other known development techniques. Although the present invention was developed specifically to quantify dynamic crash pulses, it should be understood that the present invention may be applicable to a wide variety of CAE waveforms and may even be applicable to the quantization and evaluation of waveforms developed outside the CAE environment.

The present invention includes a CAE resultant waveform 12 also known as an evaluation waveform. Specifically, the present invention was assigned to evaluate a dynamic crash pulse waveform 14. The CAE resultant waveform 12 is evaluated in reference to a reference waveform 16. Although a wide variety of reference waveforms 16 are contemplated by the present invention, the present invention preferably utilizes a reference waveform 16 in which a high level of engineering confidence preexists. It is contemplated that the reference waveform 16 may be derived through a variety of methods. In one embodiment, the reference waveform 16 is derived from sensor output from a physical testing scenario. In other embodiments, however, the reference waveform 16 may be derived from a variety of sources including, but not limited to, prior high confidence CAE analysis.

The evaluation of the CAE resultant waveform 12 is accomplished through the use of a dual indexing arrangement. Specifically, the CAE waveform assessor 10 includes a time domain assessor 18 and a frequency domain assessor 20. The time domain assessor 18 and the frequency domain assessor 20 compare the CAE results of waveform 12 with the reference waveform 16 to produce a time domain index 22 and a frequency domain index 24, respectively. The time domain index 22 and the frequency domain index 24 are fed into an overall index assessor 26, which in turn processes them to provide an overall index 28. In this fashion, the CAE resultant waveform 12 is given an objective rating as compared to the reference waveform 16 to provide a quantifiable index for evaluating CAE resultant waveform 12.

Although it is contemplated that the time domain assessor 18 may function in a variety of fashions, in one embodiment, the time domain assessor 18 includes a first CAE waveform integrator 30 and a first reference waveform integrator 32. These first integrators 30, 32 integrate the CAE resultant waveform 12 and the referenced waveform 16, respectively. The results of the first CAE integrator 30 and the first reference waveform integrator 32 are then provided to a time summing element 34 to calculate the variation and velocity between the CAE resultant waveform 12 and the reference waveform 16. The time domain assessor 18 may further include a second CAE waveform integrator 36 and a second reference waveform integrator 38. The second integrators 36, 38 are utilized to truncate the waveforms 12, 16 into proper duration for sensor calibration purposes. The techniques for double integrating waveforms are well understood in the art.

The differential results created by the time summing element 34 are provided to a time frame indexer 40. Although the individual time frames may be indexed in a variety of fashions, one indexing scheme is FIG. 2A. The timeframe indexer 40 preferably provides time frame index value 42 based upon the percentage of difference 44 between each timeframe from the CAE resultant waveform 12 as compared to the reference waveform 16. The resultant plurality of timeframe indexes 42 are subsequently provided to a time domain indexer 46. Although the time domain indexer 46 may be configured in a variety of fashions, one embodiment is illustrated in FIG. 2B. The time domain indexer 46 illustrated in FIG. 2B uses a percentage of occurrence of each of the plurality of time frame indexes 42 to create the time domain index 22.

The other half of the dual indexing scheme comprises the frequency domain assessor 20. Although it is contemplated that a variety of frequency indexing schemes may be utilized, in one embodiment, the frequency domain assessor 20 includes a CAE waveform fast fourier transform 48 and a reference waveform fast fourier transform 50. The resultant output from these fast fourier transforms 48, 50, are compared utilizing a frequency sum element 52. The CAE resultant waveform 12 and the reference waveform 16 are preferably analyzed by the frequency domain assessor 20 by comparing them in predefined regions 54. Although a variety of predefined regions 54 are contemplated, one embodiment defines such regions by a first large peak region 56, 0–50 Hz region 58, a 50–400 Hz region 60, a 220–370 Hz region 62 and a 400–600 Hz region 64. In addition, each region may be analyzed using a variety of frequency comparison factors as illustrated in FIG. 3B.

The frequency domain assessor 20 further includes a frequency rating element 66. Frequency rating element 66 utilizes the results from a frequency sum element 52 to develop a frequency region index 70 for each predefined region 54. Although a variety of indexing schemes may be utilized by the frequency rating element 66, one embodiment contemplates the use of a frequency index table as illustrated in FIG. 3A. It should be understood that the values illustrated as the frequency region index 70, the predefined regions 54, as well as the percent differences illustrated within FIG. 3A are for illustrative purposes only and may be modified as desired. It is further contemplated that the frequency region indexes 70 may be stored within a frequency matrix 68 in order to supply the frequency domain index 54 to the overall index assessor 26.

The present invention further includes the overall index assessor 26 which combines the time domain index 22 with the frequency domain index 24 in order to produce an overall index 28. Although the overall index assessor 26 may function in a variety of fashions, one embodiment contemplates the use of an index merging element 72 to combine the time domain index 22 with the frequency domain index 24. Similarly, the index merge element 72 is contemplated to function in a variety of fashions. The methods and/or algorithms utilized by the index merge element 72 can be modified and were optimized based upon the CAE resultant waveform's location or type. One example of such an overall indexing scheme is illustrated in FIG. 4. Additionally, it is contemplated that the overall index assessor 26, and more specifically the index merge element 72, may further include an additional constraint component 74 as is illustrated in FIG. 5. The additional constraint component 74 can be utilized to modify the generalized overall index calculations for specific known scenarios. The embodiment illustrated in FIG. 5 utilizes the waveform location 76 and the zero index accumulation velocity rating 78 to set the overall index 28 at zero where the zero index accumulation 78 is greater than 20 or 30 percent respectively. It should be understood that this illustration as well as the values utilized are for illustrative purposes only.

It is contemplated that the overall index 28 may be output by the overall index assessor 26 in a variety of fashions. The overall index 28 may be output as document 80, as a plot 82, or in a variety of other forms that would be obvious to one skilled in the art. In addition, it is contemplated that the respective overall index 28 may be utilized to dictate how the CAE resultant waveform 12 is recommended for treatment by engineers. FIG. 6 illustrates one such guideline 83. At high overall index 28 levels, as an example, the CAE resultant waveform 12 can be utilized to simulate a test condition. At mid levels, the CAE resultant waveform 12 can be used as a test variation. And at low overall index 28 levels, the CAE resultant waveform 12 is utilized as a reference only. It should be understood that although one set of usage guidelines have been illustrated, a variety of usage guidelines based upon overall indexing 28 can be developed based upon industry or analysis philosophies.

Figure 7:
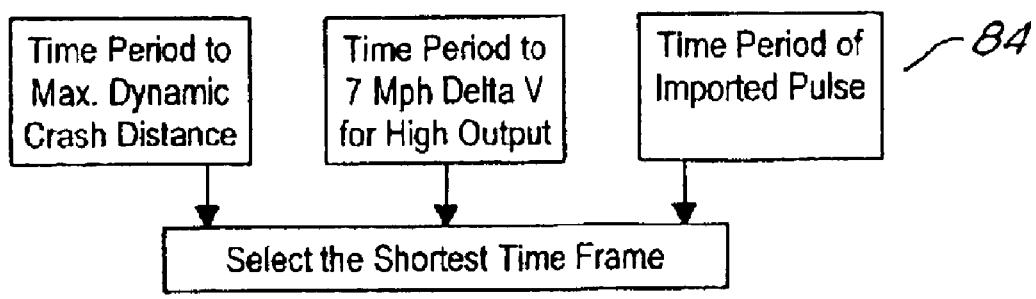
FIG. 7 is an illustration of a waveform duration calculation flow chart for use with the CAE waveform assessor.
Figure 8:
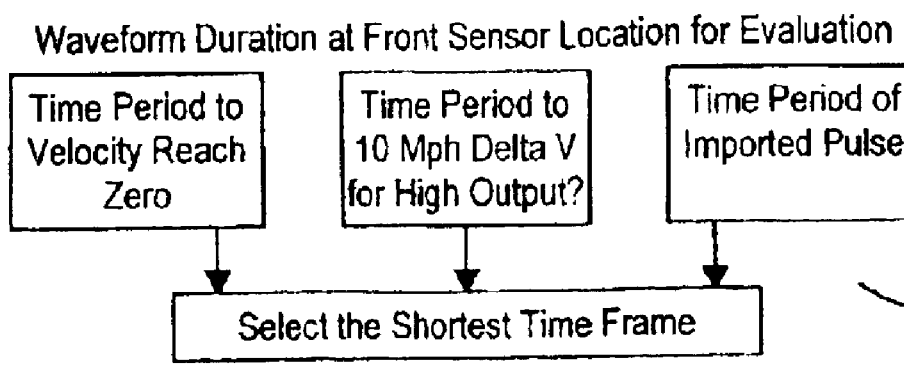
FIG. 8 is an alternate embodiment of a waveform calculation flow chart for use with the CAE waveform assessor.

Finally, it is contemplated that a variety of CAE waveforms 12 may be inputted into the CAE waveform assessor 10 and yet it may be desirable to control the length of the CAE resultant waveform 12 duration for analysis purposes. The present invention may, therefore, further include a waveform duration limiter 26 (see FIG. 7) for treatment of the CAE resultant waveform 12 prior to submission to the indexing agents 18, 20, 26. An alternate CAE waveform duration limiter 84 is illustrated in FIG. 8. It is further contemplated that the CAE waveform duration limiter 84 may be modified and optimized to particular locations of CAE resultant waveform 12 generation. For example, the CAE waveform duration limiter 84 illustrated in FIG. 7 was designed for a CAE resultant waveform 12 generated at a tunnel location. The CAE waveform duration limiter 84 illustrated in FIG. 8 was developed for a CAE resultant waveform 12 generated at a sensor location. It should be understood, however, that the methodologies utilized by the CAE waveform duration limiter 84 may be adapted, modified, or optimized for a variety of locations, applications, or limiting schemes.

The present invention can thereby provide an overall ranking of the dynamic crash pulse 14 in addition to an indicated category the pulse belongs to. The output from the present invention can be further utilized to suggest what portion of the dynamic crash pulse 14 waveform that can be improved, the improvement direction, and the reliability of additional CAE outputs. Finally, the present invention provides a benefit by implementing the ranking system that can be implemented into both waveform generation as well as waveform usage.

While particular embodiments of the invention have been shown and described, numerous variations and alternative embodiments will occur to those skilled in the art. Accordingly, it is intended that the invention be limited only in terms of the appended claims.

What is claimed is:

1. A dynamic crash pulse wave assessor comprising:
   a crash pulse waveform;
   a reference waveform;
   a time domain assessor including a first crash pulse waveform integrator, said time domain assessor comparing said crash pulse waveform to said reference waveform to produce a time domain index;
   a frequency domain assessor including a crash pulse waveform fast fourier transform and a reference waveform fast fourier transform, said frequency domain assessor comparing said crash pulse waveform to said reference waveform to produce a frequency domain index; and
   an overall assessor merging said time domain index and said frequency domain index to produce an overall index.

2. A dynamic crash pulse wave assessor as described in claim 1, further comprising:
   a second crash pulse waveform integrator; and
   a second reference waveform integrator.

3. A dynamic crash pulse wave assessor as described in claim 1, further comprising:
   a time frame indexer producing a time frame index by comparing said crash pulse waveform to said reference waveform.

4. A dynamic crash pulse wave assessor as described in claim 3, wherein said time frame index is based upon the percentage of difference between said crash pulse waveform and said reference waveform.

5. A dynamic crash pulse wave assessor as described in claim 1, wherein said frequency domain assessor compares said crash pulse waveform to said reference waveform based upon predefined frequency regions.

6. A dynamic crash pulse wave assessor as described in claim 5, wherein said predetermined frequency regions include first large peak, 0–50 Hz, 50–400 Hz, 220–370 Hz, and 400–600 Hz.

7. A dynamic crash pulse wave assessor as described in claim 1, wherein said frequency domain index is stored in a frequency matrix.

8. A dynamic crash pulse wave assessor as described in claim 1, further comprising:
   at least one additional constraint component modifying said overall index.

9. A dynamic crash pulse wave assessor as described in claim 8, wherein said at least one additional constraint component modifies said overall index based upon a zero index accumulation of velocity rating.

10. A dynamic crash pulse wave assessor as described in claim 1, further comprising:
    a waveform duration limiter limiting the duration of said crash pulse waveform.

11. A dynamic crash pulse wave assessor as described in claim 1, further comprising:
    a treatment guideline utilizing said overall index.

* * * * *